United States Patent
Donkers et al.

(10) Patent No.: US 9,147,732 B2
(45) Date of Patent: Sep. 29, 2015

(54) GROUP 13 NITRIDE SEMICONDUCTOR DEVICE AND METHOD OF ITS MANUFACTURE

(71) Applicant: NXP B.V., Eindhoven (NL)

(72) Inventors: Johannes Theodorus Marinus Donkers, Valkenswaard (NL); Stephan Heil, Eindhoven (NL); Romain Delhougne, Boortmeerbeek (BE); Hans Broekman, Nijmegen (NL)

(73) Assignee: NXP B.V., Eindhoven (NL)

( * ) Notice: Subject to any disclaimer, the term of this patent is extended or adjusted under 35 U.S.C. 154(b) by 11 days.

(21) Appl. No.: 13/887,065

(22) Filed: May 3, 2013

(65) Prior Publication Data
US 2013/0299846 A1    Nov. 14, 2013

(30) Foreign Application Priority Data
May 9, 2012 (EP) .................... 12167365

(51) Int. Cl.
*H01L 29/20* (2006.01)
*H01L 29/66* (2006.01)
*H01L 21/285* (2006.01)
*H01L 29/45* (2006.01)

(52) U.S. Cl.
CPC ...... *H01L 29/2003* (2013.01); *H01L 21/28575* (2013.01); *H01L 29/452* (2013.01); *H01L 29/66431* (2013.01)

(58) Field of Classification Search
CPC ...................... H01L 29/2003; H01L 29/66431
USPC ........ 257/76, 15, 743, 102, 103; 438/571, 29, 438/46, 509, 796
See application file for complete search history.

(56) References Cited

U.S. PATENT DOCUMENTS

| | | | |
|---|---|---|---|
| 5,834,326 A * | 11/1998 | Miyachi et al. ................. | 438/29 |
| 6,204,512 B1 | 3/2001 | Nakamura et al. | |
| 6,391,795 B1 * | 5/2002 | Catabay et al. ............... | 438/763 |
| 6,583,454 B2 | 6/2003 | Sheppard et al. | |
| 6,990,132 B2 * | 1/2006 | Kneissl et al. ............. | 372/45.01 |
| 6,995,406 B2 * | 2/2006 | Tojo et al. ..................... | 257/103 |
| 7,230,284 B2 | 6/2007 | Parikh et al. | |

(Continued)

FOREIGN PATENT DOCUMENTS

| | | |
|---|---|---|
| CN | 1102507 A | 5/1995 |
| CN | 1309816 A | 8/2001 |

(Continued)

OTHER PUBLICATIONS

Liu, Q. Z. et al. "Study of Contact Formation in AlGaN/GaN Heterostructures", IEEE Applied Physics Letters, vol. 71, No. 12, pp. 1658-1660 (Sep. 22, 1997).

Ruvimov, S. et al. "Microstructure of Ti/Al Ohmic contacts for n-AlGaN", IEEE Applied Physics Letters, vol. 73, No. 18, pp. 2582-2584 (Nov. 2, 1998).

(Continued)

*Primary Examiner* — Sheng Zhu (57) ABSTRACT

Disclosed is a semiconductor device comprising a substrate (10); at least one semiconducting layer (12) comprising a nitride of a group 13 element on said substrate; and an ohmic contact (20) on the at least one semiconducting layer, said ohmic contact comprising a silicon-comprising portion (22) on the at least one semiconducting layer and a metal portion (24) adjacent to and extending over said silicon-comprising portion, the metal portion comprising titanium and a further metal. A method of manufacturing such a semiconductor device is also disclosed.

15 Claims, 4 Drawing Sheets

(56) References Cited

U.S. PATENT DOCUMENTS

| | | |
|---|---|---|
| 7,875,537 B2 | 1/2011 | Suvorov et al. |
| 8,404,508 B2 | 3/2013 | Lidow et al. |
| 2002/0146856 A1 | 10/2002 | Morita |
| 2003/0020092 A1 | 1/2003 | Parikh et al. |
| 2009/0146282 A1* | 6/2009 | Tay et al. .................. 257/686 |
| 2010/0109051 A1 | 5/2010 | Wu et al. |
| 2010/0258843 A1 | 10/2010 | Lidow et al. |
| 2011/0233612 A1 | 9/2011 | Park et al. |

FOREIGN PATENT DOCUMENTS

| | | |
|---|---|---|
| CN | 1316782 A | 10/2001 |
| CN | 1343015 A | 4/2002 |
| CN | 1381897 A | 11/2002 |
| CN | 1557024 A | 12/2004 |
| CN | 101790779 A | 7/2010 |
| CN | 102388441 A | 3/2012 |
| EP | 2 273 553 A2 | 1/2011 |
| JP | 2008 108789 A | 5/2008 |
| JP | 2009 302388 A | 12/2009 |
| JP | 2011 077123 A | 4/2011 |
| WO | 2012/003609 A1 | 1/2012 |

OTHER PUBLICATIONS

Cai, S. J. et al. "High Performance AlGaN/GaN HEMT with Improved Ohmic Contacts", IEEE Electronic Letters, vol. 34, No. 24, pp. 2354-2356 (Nov. 26, 1998).

Klootwijk, J. H. et al. "Merits and Limitations of Circular TLM Structures for Contact Resistance Determination for Novel III-V HBTs", IEEE Proceedings of the International Conference on Micrelectronic Test Structures, pp. 247-252 (2004).

Mohammed, F. M. et al. "Si-induced Enhancement of Ohmic Performance of Ti/Al/Mo/Au Metallisation of AlGaN/GaN HEMTs", IEEE Electronics Letters, vol. 41, No. 17, 2 pgs (Aug. 18, 2005).

Kramer, Mark C. J. C. M "Gallium Nitride-based Microwave High-Power Heterostructure Field-Effects Transistors—Design Technology, and Characterization" PHD Thesis, 256 pgs, retrieved from the Internet at: alexandria.tue.nl/extra2/200611998.pdf (2006).

Extended European Search Report for Patent Appln. No. 12167365.1 (Oct. 1, 2012).

Kim, N.-Y. et al. "Electrical Characterization and Nanoscale Surface Morphology of Optimized Ti/Al/Ta/Au Ohmic Contact of AlGaN/GaN HEMT", Nanoscale Research Letters, 4 pgs retrieved from the internet at: www.nanoscalereslett.com/content/7/1/107> (Feb. 7, 2012).

* cited by examiner

GROUP 13 NITRIDE SEMICONDUCTOR DEVICE AND METHOD OF ITS MANUFACTURE

CROSS-REFERENCE TO RELATED APPLICATIONS

This application claims the priority under 35 U.S.C. §119 of European patent application no. 12167365.1, filed on May 9, 2012, the contents of which are incorporated by reference herein.

FIELD OF THE INVENTION

The present invention relates to a semiconductor device comprising a substrate; at least one semiconducting layer comprising a nitride of a group 13 (also known as Group III) element on said substrate; and an ohmic contact on the at least one semiconducting layer.

The present invention further relates to a method of manufacturing such a semiconductor device.

BACKGROUND OF THE INVENTION

Over the last few years, semiconductor devices based on group 13 nitrides such as GaN have drawn considerable interest because of their promise in high-temperature and high-power applications, e.g. power and microwave amplification, RF signal processing and sensor applications.

A unique feature of group 13-nitrides like AlN, GaN and InN is the large difference in electronegativity. Nitrogen is the most electronegative group V element. This results in spontaneous polarization in the group 13 nitrides. In addition, strain in the crystal structure of these materials enhances the polarization effect. In GaN/AlGaN heterostructures, this additional piezoelectric polarization due to the differences in crystal lattice parameters gives rise to a two-dimensional electron gas formed at the heterojunction between these two layers. This two-dimensional electron gas forms the conducting channel between the source and drain of a normally-on high electron mobility transistor (HEMT).

It is important to create a low-ohmic contact to the two-dimensional electron gas in order to successfully utilize these devices in high-performance application domains. Most ohmic contacts on GaN/AlGaN heterostructures are based on Ti/Al-based metallization schemes. Titanium creates nitrogen vacancies by forming TiN, which enables electrons to tunnel to the two-dimensional electron gas underneath the AlGaN. Aluminium is present to react with Ti to prevent oxidation of the titanium.

Typically, gold is used as the bulk metal on top of the aluminium, and is separated from the aluminium by one or more diffusion barriers. Most frequently reported metallization schemes include Ti/Al/Ti/Au, Ti/Al/Ni/Au and Ti/Al/Pt/Au.

However, the use of gold adds significant cost to the manufacturing process of such semiconductor devices, not in the least because gold is not commonly used in existing manufacturing processes such as a CMOS process. This therefore requires significant redesign of the manufacturing process, which is undesirable from a cost perspective.

To be able to process group 13 nitride semiconductor devices such as GaN/AlGaN high-electron mobility transistors (HEMTs) on silicon substrates in a main-stream semiconductor fab, such as a silicon-based fab, gold has to be eliminated from the manufacturing process. It is however far from trivial to make this elimination without suffering an increase in the contact resistance of the ohmic contacts, thereby compromising the performance of the semiconductor device.

F. M. Mohammed et al. In Electr. Letters, 41 (17), 2005, pages 984-985, disclose a Ti/Si/Al/Si/Mo/Au layer stack as an ohmic contact for a AlGaN/GaN HEMT. Upon annealing such a contact at 850° C. for 30 seconds, it was found that the incorporation of the silicon layers in this stack caused the formation of silicided inter-metallics as well as the unintentional doping of the AlGaN/GaN heterostructures with silicon, which lead to a contact resistivity of 0.16 Ω·mm and a specific contact resistivity of $6.77 \times 10^{-7}$ Ω·cm$^2$.

However, this ohmic contact still relies on gold as the bulk metal, which is undesirable as previously explained. Moreover, it has been experimentally found, e.g. by the present inventors, that the presence of the Si layer in the complete bulk contact causes problems in terms of reproducibility of the quality of the contact in industry-scale manufacturing processes.

SUMMARY OF THE INVENTION

The present invention seeks to provide a semiconductor device according to the opening paragraph that comprises a low-ohmic contact that can be produced in a reproducible manner.

The present invention further seeks to provide a method of manufacturing such a semiconductor device.

According to a first aspect of the present invention, there is provided a semiconductor device comprising a substrate; at least one semiconducting layer comprising a nitride of a group 13 element on said substrate; and an ohmic contact on the at least one semiconducting layer, said ohmic contact comprising a silicon-comprising portion on the at least one semiconducting layer and a metal portion adjacent to and extending over said silicon-comprising portion, the metal portion comprising titanium and a further metal.

It has been surprisingly found that by providing portions of a silicon source in such an ohmic contact that do not extend over the full width of the contact significantly improves the practicality of producing the Si-containing ohmic contact whilst at the same time providing a contact having a sufficiently low contact resistance to facilitate the use of the semiconductor device in challenging application domains such as high-temperature and high-power applications. Moreover, by the provision of one or more silicon-containing portions at least partially adjacent to the metal portion, it is not necessary to provide multiple layers of a silicon-containing material to ensure that each metal in the ohmic contact can react with the silicon.

The further metal inter alia has the function of protecting the titanium from oxidation. Preferably, the further metal is aluminium.

In an embodiment, the silicon source of the silicon-comprising portion is selected from silicon, silicon oxide and silicon nitride, which is advantageous because such materials are already commonly available in existing mainstream semiconductor manufacturing processes.

In an embodiment, the metal portion comprises a titanium layer on the at least one semiconducting layer and extending over the silicon-comprising portion; and a layer of the further metal on the titanium layer, and/or an alloy layer of the titanium and the further metal. It has been found that a metal portion comprising a layer stack of titanium and aluminium is particularly suitable for providing reproducible low-ohmic contacts in existing semiconductor processes. Preferably, the ohmic contact does not contain gold.

In an embodiment, the semiconductor device comprises a first silicon-comprising portion and a second silicon-comprising portion laterally separated from the first silicon-comprising portion, and wherein a part of the metal portion extends between the first silicon-comprising portion and the second silicon-comprising portion. In such an arrangement, the silicon-containing portion may be completely embedded in the metal portion, e.g. may form a plurality of stripes in the ohmic contact. Alternatively, the silicon-containing portions may define spacers in the ohmic contact, in which case the silicon-containing portions may not be entirely covered by the metal portion.

The nitride of the group 13 element may be selected from aluminium nitride, gallium nitride and indium nitride. Preferably, the nitride is GaN.

The at least one semiconducting layer on said substrate may comprise a gallium nitride layer and an aluminium gallium nitride barrier layer in between said gallium nitride layer and the ohmic contact, such that a two-dimensional electron gas may be formed at the interface between the GaN layer and the AlGaN barrier layer that can be contacted with the ohmic contact.

The semiconductor device may be a Schottky diode or a high electron mobility transistor.

The semiconductor device of the present invention may form part of an integrated circuit, such as a power amplifier circuit, a radiofrequency signal processing circuit or a sensor circuit.

In accordance with another aspect of the present invention, there is provided a method of manufacturing a semiconductor device, comprising providing a substrate having thereon at least one semiconducting layer comprising a nitride of a group 13 element; and forming an ohmic contact on the at least one semiconducting layer by forming a silicon-comprising layer on the at least one semiconducting layer; patterning said silicon-comprising layer to form a silicon-comprising portion; depositing a metal portion comprising titanium and aluminium on the resultant structure; patterning the metal portion and the patterned silicon-comprising layer using at least one etch recipe; and annealing the resultant structure to react the metal portion with silicon from the silicon-comprising layer.

Such a manufacturing method allows for the reproducible production of a group 13 nitride semiconductor element having a sufficiently low ohmic contact in an existing manufacturing process such as a silicon-based process, e.g. CMOS.

In an embodiment, the step of depositing a metal portion comprises depositing a titanium layer on the resultant structure and depositing an aluminium layer on the titanium layer. Such a metal portion is particularly suited to the provision of a reliable ohmic contact to the group 13 nitride semiconducting layer. Such a metal portion may be deposited by evaporation or physical vapor deposition.

In an embodiment, said patterning step comprises patterning the metal portion using the silicon-comprising portion as an etch stop; and further patterning the silicon-comprising portion using the at least one semiconducting layer as an etch stop. Such a two-step process improves the control over the patterning step, thus yielding well-defined contact structures.

In an embodiment, said annealing step is performed in a range of 600-900° C. This temperature is high enough to promote reaction of the silicon with the metal portion.

BRIEF DESCRIPTION OF THE EMBODIMENTS

Embodiments of the invention are described in more detail and by way of non-limiting examples with reference to the accompanying drawings, wherein.

DETAILED DESCRIPTION OF THE DRAWINGS

It should be understood that the Figures are merely schematic and are not drawn to scale. It should also be understood that the same reference numerals are used throughout the Figures to indicate the same or similar parts.

The present invention targets the provision of an ohmic contact to a semiconducting layer comprising a group 13 nitride, such as GaN. It should be understood that the semiconducting layer may not be the upper layer in direct contact with the ohmic contact, but may instead be an intermediate layer or even a lower layer on the substrate of the semiconductor device. Multiple layers may be present on the substrate.

In particular, the semiconductor device may comprise a heterostructure, such as a AlGaN barrier layer on a GaN buffer layer, at the interface of which a 2-dimensional electron gas may be induced. A capping layer over the barrier layer, e.g. a GaN capping layer, may be present over the barrier layer and a further layer, e.g. an AlN layer may separate the buffer layer from an underlying substrate such as a Si substrate.

However, it should be understood that the present invention is not necessary limited to a GaN-based semiconductor device, and that other group 13 nitrides, e.g. AlN and InN may also be used, although a GaN-based technology is preferred.

The semiconductor device may have any suitable functionality. In particular, the semiconductor device may be a Schottky diode or a (normally-on) HEMT, although other functionalities may also be contemplated.

A method of providing such a semiconductor device with an ohmic contact in accordance with an embodiment of the present invention will now be discussed in more detail with the aid of FIG. 1-4. The method commences in FIG. 1 with the provision of a substrate 10 onto which at least one group 13 metal nitride-based layer 12 is provided, such as a GaN layer. In the remainder of this application the at least one layer 12 shall be referred to as a GaN layer for the sake of simplicity but it should be understood that other group 13 metal nitrides, e.g. AlN and InN may also be contemplated.

Preferably, the at least one GaN-based layer 12 comprises a heterostructure as explained above. Such a substrate carrying at least one GaN-based layer 12 can be obtained commercially; for instance, Dowa Electrics Materials supplies a substrate having the following layer stack grown epitaxially on (111) silicon: ~3 nm GaN on ~20 nm $Al_xGa_{1-x}N$ (0<x<1) on 1.5 μm GaN on a 3.3 μm GaN buffer. The GaN buffer is grown on the (111) silicon. As suitable substrates can be commercially obtained and their manufacture is outside the scope of the present invention, this will not be explained in more detail for reasons of brevity only.

Figure 1:
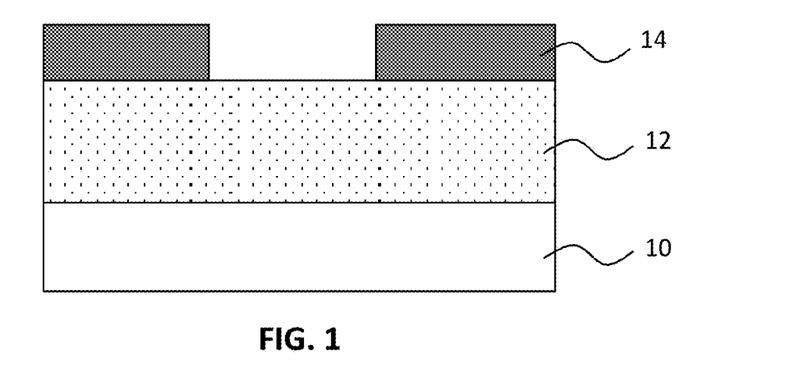
FIG. 1-4 schematically depict various steps in the manufacture of a semiconductor device according to an embodiment of the present invention.

In a next step, a silicon-containing layer 14 such as a silicon layer, a silicon oxide layer or a silicon nitride layer is deposited on the one GaN-based layer 12 using any suitable deposition technique, e.g. by chemical or physical vapor deposition. The silicon-containing layer 14 is subsequently patterned, e.g. using a suitable etch recipe, leading to the intermediate structure as shown in FIG. 1.

The method then proceeds with the deposition of a titanium layer 16 and a further metal layer 18 to protect the titanium layer 16 from oxidation. Preferably, the further metal layer 18 is a layer stack comprising an aluminium layer on the titanium layer, which may be protected with a capping layer such as a TiW or TiN layer, although instead of the aluminium layer other suitable metals that protect the titanium layer 16 from oxidation may also be contemplated. The titanium layer 16 and the further metal layer 18 may be deposited in any suitable manner, e.g. by evaporation or physical vapor deposition. The resultant structure is shown in FIG. 2.

Figure 2:
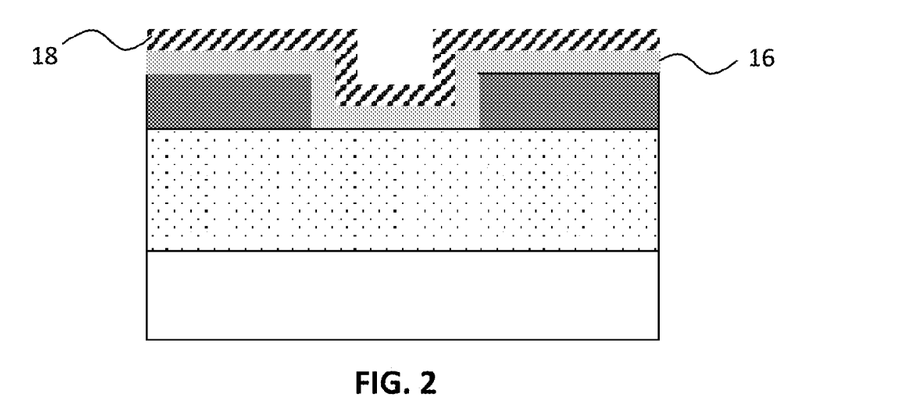
Figure 3:
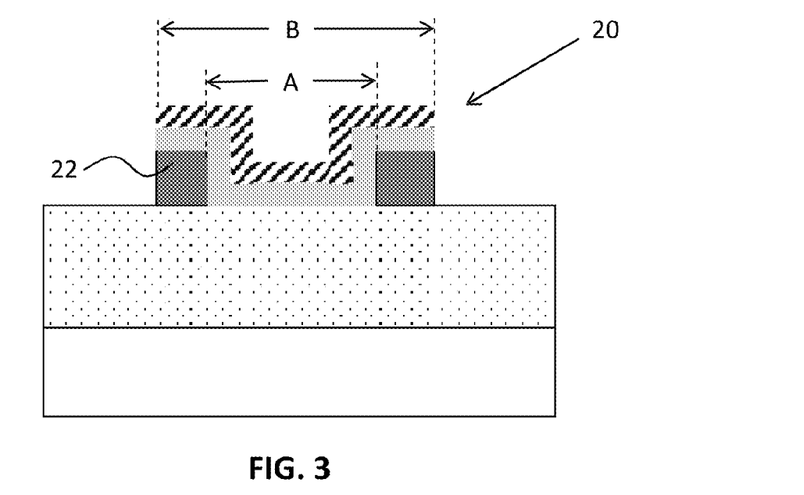

Next, the ohmic contact 20 is formed as shown in FIG. 3 by patterning the resultant structure of FIG. 2, e.g. by a suitable etch recipe. In an embodiment, a two-step etch process is applied; a first etch step in which the further metal layer 18 and the underlying titanium layer 16 are patterned using a resist (not shown), and using the previously patterned silicon-containing layer 14 as an etch stop. The resist may be stripped in-situ in the etch chamber. A subsequent etch step is then performed in which the exposed parts of the silicon-containing layer 14 are patterned using the at least one GaN layer 12 as an etch stop layer. It is noted for the sake of clarity that in case of the GaN layer 12 forming part of a layer stack, the upper layer of the layer stack is used as the etch stop layer.

Preferably, in case of the silicon-containing layer 14 comprising a silicon nitride, a suitable etch chemistry such as a $CF_4$, $SF_6$ or a fluorine-based dry etch chemistry is used to pattern the silicon-containing layer 14, as it has been found that such an etch chemistry has no detrimental effects on the behavior of the 2-dimensional electron gas formed at the interface of a heterostructure of the semiconductor layer stack of the semiconductor device.

After the patterning step, a rapid thermal anneal is performed, typically in the range of 600-900° C., depending on the thickness of the titanium layer 16 and the further metal layer 18. For instance, in case of a layer stack comprising a 75 nm thick titanium layer and a 115 nm thick aluminium layer using silicon nitride spacers, a rapid thermal anneal comprising a first anneal step of 60 seconds at 600° C. and a second anneal step of 60 seconds at 875° C. proved sufficient to cause sufficient interaction of the silicon with the metal layers to provide a low-ohmic contact 20.

Figure 4:
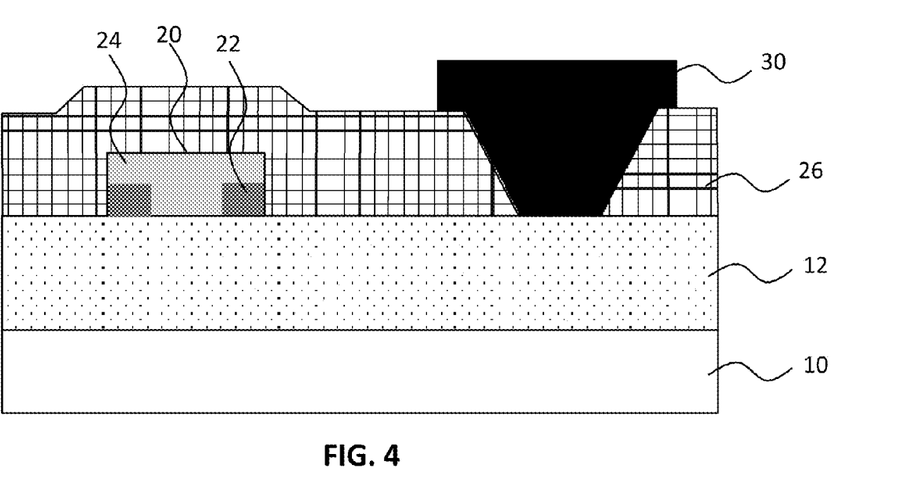

Following the rapid thermal anneal, the semiconductor device may be completed using conventional techniques that are known per se to the skilled person, such that these further steps will only be briefly explained. FIG. 4 depicts a semiconductor device after the completion of at least some of these conventional steps.

A passivation layer 26 is formed over the resultant structure of FIG. 3, such as a silicon nitride ($SiN_x$) passivation layer, after which an etching step is performed to define an opening for a Schottky contact such as a gate contact to the GaN layer 12, followed by the deposition and patterning of the gate metal to form the Schottky contact 30. The ohmic contact 20 comprises a pair of laterally separated silicon-containing spacers 22 in between which a metal portion 24 is present that at least partially covers the silicon-containing spacers 22. The metal portion 24 may comprise a titanium layer and a further metal layer such as an aluminium layer as separate layers, although depending of the temperature and the duration of the thermal anneal step it is feasible that some interdiffusion between these separate metal layers has taken place, thereby forming an interdiffused metal portion 24.

After the formation of the Schottky contact 30, the semiconductor device may be finalized, e.g. by the deposition of a further passivation layer, the definition of the openings through the further passivation layer to provide access to the various contacts of the semiconductor device followed by the backend metallization.

Although FIG. 4 shows a two-terminal semiconductor device, e.g. a Schottky diode, it is of course equally feasible that the semiconductor device comprises a further ohmic contact 20 to provide access to the source and drain regions respectively of e.g. a HEMT.

It is furthermore stipulated that FIG. 4 is not intended to give a complete representation of such a semiconductor device; for instance, the substrate may contain (trench) isolation regions (not shown) to electrically isolate the various semiconductor devices from each other. Other design features may also be present that are routinely used in semiconductor devices and integrated circuits or wafers comprising a plurality of such semiconductor devices that may advantageously be used in conjunction with one or more embodiments of the present invention, and such features will be immediately apparent to the skilled person.

Figure 5:
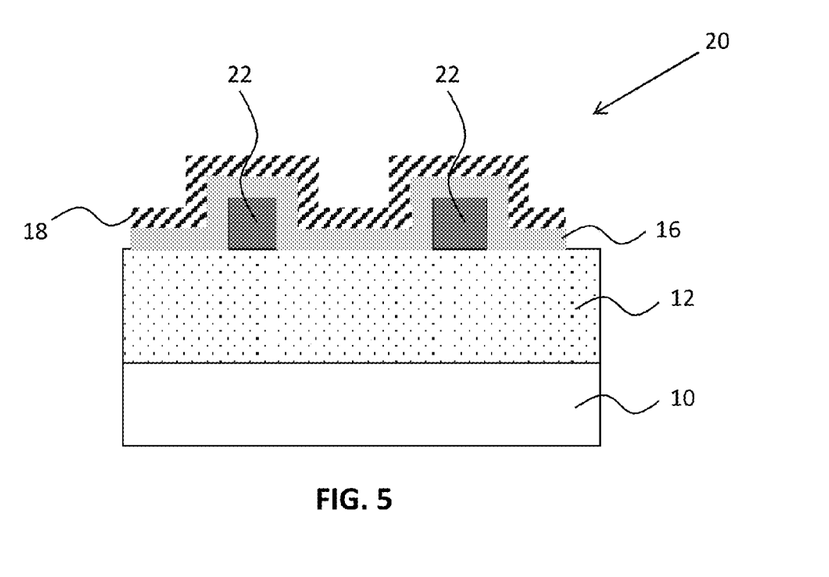
FIG. 5 schematically depicts an aspect of a semiconductor device according to an alternative embodiment of the present invention.

It is moreover not necessary that the silicon-containing portions 22 of the one or more ohmic contacts are only partially covered by the metal portion 24. An alternative embodiment is shown in FIG. 5, in which the ohmic contact 20 comprises one or more silicon-containing stripes 22 such as silicon nitride ($SiN_x$) stripes, which are completely enveloped by the metal portion, e.g. by a titanium layer 16 and a further metal layer 18 such as an aluminium layer or another metal capable of protecting the titanium layer from oxidation. An ohmic contact 20 containing such stripes may be manufactured at the cost of one additional mask step (to define the stripes) compared to an ohmic contact 20 comprising silicon-containing spacers having an exposed side wall at the edge of the contact, as the same mask may be used to pattern the silicon-containing layer 14 and metal layers 16 and 18 in the case of such spacers.

The number and/or the dimensions of the silicon-containing portions 22 may be chosen to tune the amount of silicon to which the metal portion is exposed. To this end, the silicon content in the silicon portions 22 may also be varied, e.g. by changing the recipe of a $SiN_x$ composition. This way, the amount of silicon reacting with the metal portion can be accurately controlled, thus providing precise control over the conductive properties of the ohmic contact 20. This is a particular advantage over the prior art ohmic contact disclosed by Mohammed et al., in which such precise control is far from trivial due to the fact that a silicon nitride layer is used extending over the full area of each metal layer of the ohmic contact disclosed therein.

The present invention will now be described in more detail with the aid of the following non-limiting examples. It should be understood that many variations to these examples will be possible without departing from the teachings of the present invention.

EXAMPLE 1

An ohmic contact was formed by the deposition of a 100 nm thick silicon nitride layer using plasma enhanced vapor deposition on a wafer comprising a (111) silicon substrate having the following layer stack grown epitaxially on (111) silicon: ~3 nm GaN on ~20 nm $Al_xGa_{1-x}N$ (0<x<1) on 1.5 μm GaN on a 3.3 µm GaN buffer, as obtained from Dowa Electrics Materials. After patterning the silicon nitride layer, a 75 nm thick titanium layer and a 115 nm thick aluminium layer were formed over the resultant structure by evaporation. An ohmic contact as shown in FIG. 3 was subsequently formed by patterning, thus forming silicon nitride spacers having a lateral width of 0.4 micron. The ohmic contact which was subsequently exposed to a first rapid thermal anneal step at 600° C. for 60 seconds, followed by a second rapid anneal step at 875° C. for 60 seconds.

EXAMPLE 2

An ohmic contact was formed as described in Example 1, with the difference that the silicon nitride spacers have a lateral width of 2.0 micron.

COMPARATIVE EXAMPLE 1

An ohmic contact was formed as described in Example 1, with the difference that the silicon nitride spacers were omitted from the ohmic contact.

The respective contact resistances of the ohmic contacts of Example 1, Example 2 and Comparative Example 1 were determined using a standard circular transfer length method as for instance described by J. H. Klootwijk et al. in Proc. IEEE 2004 Int. Conference on Microelectronic test Structures, Vol. 17, March 2004, pages 247-252. From these measurements, the contact resistivity including the transfer length and the GaN sheet resistance were calculated.

The contact area of the ohmic contacts of Example 1 and Example 2 has been defined in two ways, as shown in FIG. 3; a first contact area A excluding the silicon nitride spacers and a second contact area B including the silicon nitride spacers. The inclusion of the contact area B appears reasonable as it may be expected that some of the silicon nitride spacer has become metallic through silicidation. The results of these measurements are shown in Table I.

TABLE I

|  | Example 1 (A) | Example 1 (B) | Example 2 (A) | Example 2 (B) | Comp. Example |
|---|---|---|---|---|---|
| GaN sheet resistance ($\Omega/\square$) | 554 | 555 | 541 | 544 | 656 |
| Transfer length (µm) | 4.9 | 6.4 | 1.2 | 2.9 | 9.6 |
| Contact resistance ($\Omega \cdot mm$) | 2.74 | 2.96 | 0.60 | 1.70 | 6.32 |
| Contact resistivity ($\Omega \cdot cm^2$) | $1.37 * 10^{-4}$ | $1.59 * 10^{-4}$ | $7.69 * 10^{-6}$ | $5.35 * 10^{-5}$ | $6.08 * 10^{-4}$ |

It will be apparent from Table I that the inclusion of a silicon-containing spacer such as a silicon nitride spacer significantly improves the conductive properties of the ohmic contact of the present invention compared to an ohmic contact in which such a silicon source is absent. In addition, it has been shown that for a wider spacer the contact resistivity can be further decreased.

In fact, the conductive properties of the ohmic contact according to an embodiment of the present invention approaches the properties of the ohmic contact disclosed by Mohammed et al., despite the absence of gold as a bulk contact material. This clearly demonstrates that by tuning of the amount of silicon-containing portions inside the ohmic contact, the need to use gold to achieve acceptable low-ohmic characteristics of such contacts can be successfully avoided.

Although not wanting to be bound by theory, it is believed that the reduction in the resistivity of the ohmic contacts according to embodiments of the present invention can be largely contributed to the migration of the silicon from the silicon-containing portions 22 to the metal layers 16 and 18 during the anneal step(s) in the manufacture of the ohmic contact, where the silicon reacts with the metals to form $MSi_x$ structures, rather than by migration of the silicon into the GaN layer, as such doping typically requires higher anneal temperatures, e.g. at least 1100° C.

Figure 6:
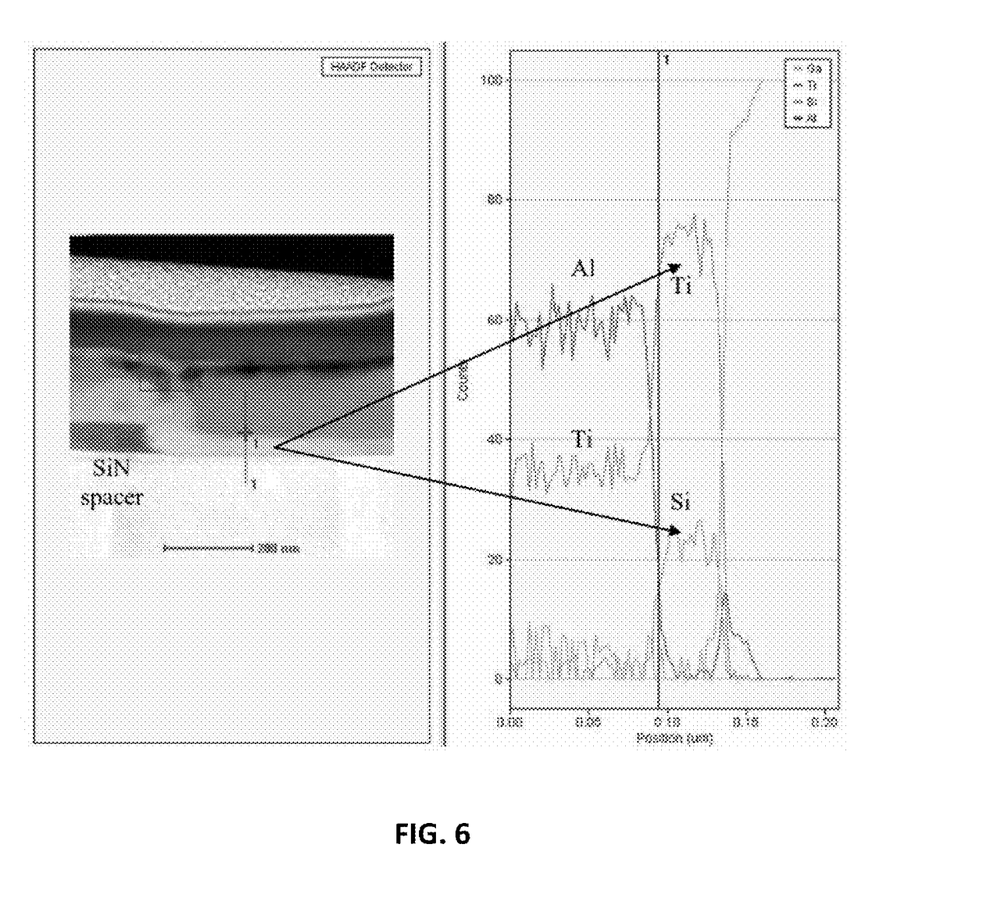
FIG. 6 depicts a high angle annular dark field image and a corresponding line scan through a part of a semiconductor device according to an embodiment of the present invention.
Figure 7:
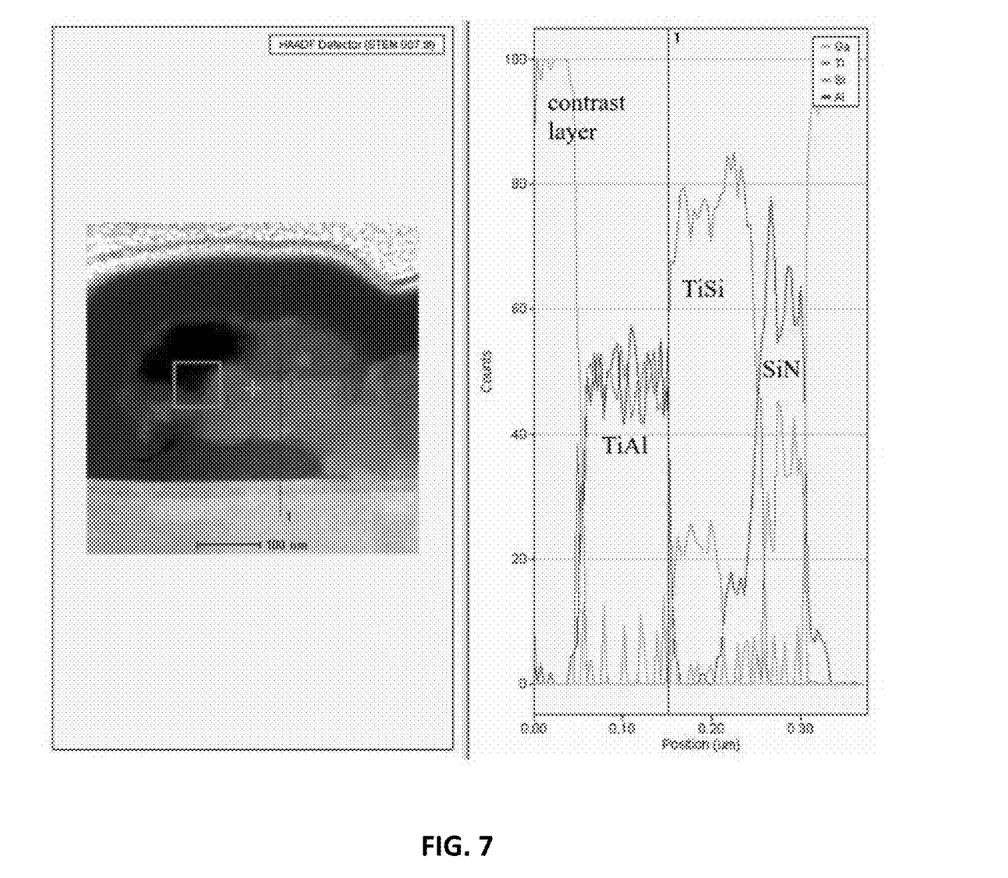
FIG. 7 depicts a high angle annular dark field image and a corresponding line scan through another part of a semiconductor device according to an embodiment of the present invention.

This for instance is corroborated by an analysis of the ohmic contact formed in Example 2, using Transmission Electron Microscopy micrographs (left pane) and element scans (right pane) through the metal contact (FIG. 6) and the silicon nitride spacer region (FIG. 7).

FIG. 6, right hand pane clearly demonstrates the formation of a Ti—Si compound in the bottom metal layer of the ohmic contact adjacent to the silicon nitride spacer and underneath the Ti—Al interdiffusion region. The silicon nitride spacer is clearly visible in the left hand pane of FIG. 6.

The element scan through the silicon nitride spacer in FIG. 7 clearly demonstrates a high Al content in the SiN spacer, a Ti—Si compound above the spacer as also demonstrated adjacent to the spacer in FIG. 6, and a Ti—Al interdiffusion region above the Ti—Si region. The high Si content present in the element scan in FIG. 7 originates from a contrast layer.

In other words, FIGS. 6 and 7 clearly demonstrate that the ohmic contact according to embodiments of the present invention comprises a region at the interface or boundary of the silicon containing portion and the metal portion that comprises the reaction product of silicon and titanium, and that an interdiffusion region may be present at the interface or boundary of the titanium layer and the further metal layer, e.g. an alloy of the titanium layer and the further metal layer may have been formed in the anneal step. The presence of such an interdiffusion region is likely to depend on the annealing conditions used to react the metal with the silicon.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A semiconductor device comprising:
    a substrate;
    at least one semiconducting layer comprising a nitride of a group 13 element on said substrate; and
    an ohmic contact on the at least one semiconducting layer, said ohmic contact comprising a silicon-comprising portion on the at least one semiconducting layer and a metal portion adjacent to and extending over said silicon-comprising portion, the metal portion comprising titanium and a further metal, wherein the ohmic contact does not contain gold, wherein the metal portion comprises a titanium layer, a layer of the further metal over the titanium layer, and a capping layer made of a material containing titanium for protecting the layer of the further metal, wherein the silicon-comprising portion comprises a first silicon-comprising portion and a second silicon-comprising portion laterally separated from the first silicon-comprising portion, wherein a part of the metal portion extends between the first silicon-comprising portion and the second silicon-comprising portion, and wherein the metal portion completely envelopes the first silicon-comprising portion and the second silicon-comprising portion.

2. The semiconductor device of claim 1, wherein the silicon source of the silicon-comprising portion is selected from silicon, silicon oxide and silicon nitride.

3. The semiconductor device of claim 1, wherein the metal portion comprises:
    the titanium layer on the at least one semiconducting layer and extending over the silicon-comprising portion; and
    the layer of the further metal over the titanium layer; and/or
    an alloy layer of said titanium and the further metal.

4. The semiconductor device of claim 1, wherein the first silicon-comprising portion and the second silicon-comprising portion are spacers or stripes.

5. The semiconductor device of claim 1, wherein the nitride of a group 13 element is selected from aluminum nitride, gallium nitride and indium nitride.

6. The semiconductor device of claim 4, wherein the at least one semiconducting layer on said substrate comprises a gallium nitride layer and an aluminum gallium nitride barrier layer in between said gallium nitride layer and the ohmic contact.

7. The semiconductor device of claim 1, wherein the further metal is aluminum.

8. An integrated circuit comprising a semiconductor device of claim 1.

9. The semiconductor device of claim 1, wherein the capping layer is made of TiW or TiN.

10. The semiconductor device of claim 1, wherein the first and second silicon-comprising portions are in direct contact with the at least one semiconducting layer, and wherein the first and second silicon-comprising portions are completely covered by the titanium layer.

11. A method of manufacturing a semiconductor device, comprising:
    providing a substrate having thereon at least one semiconducting layer comprising a nitride of a group 13 element; and
    forming an ohmic contact on the at least one semiconducting layer by:
    forming a silicon-comprising layer on the at least one semiconducting layer;
    patterning said silicon-comprising layer to form a silicon-comprising portion;
    forming a metal portion metal portion adjacent to and extending over said silicon-comprising portion by:
    depositing a metal portion comprising titanium and a further metal on the resultant structure said metal portion not containing gold, wherein the metal portion comprises a titanium layer, a layer of the further metal over the titanium layer, and a capping layer made of a material containing titanium for protecting the layer of the further metal, wherein the silicon-comprising portion comprises a first silicon-comprising portion and a second silicon-comprising portion laterally separated from the first silicon-comprising portion, wherein a part of the metal portion extends between the first silicon-comprising portion and the second silicon-comprising portion, and wherein the metal portion completely envelopes the first silicon-comprising portion and the second silicon-comprising portion; and
    patterning the metal portion and the patterned silicon-comprising layer using at least one etch recipe; and
    annealing the resultant structure to react the metal portion with silicon from the silicon-comprising layer.

12. The method of claim 11, wherein the step of depositing a metal portion comprises depositing a titanium layer on the resultant structure and depositing a further metal layer such as an aluminum layer on the titanium layer.

13. The method of claim 11, wherein the metal portion is deposited by evaporation or physical vapor deposition.

14. The method of claim 11, wherein said patterning step comprises:
    patterning the metal portion using the silicon-comprising portion as an etch stop; and
    further patterning the silicon-comprising portion using the at least one semiconducting layer as an etch stop.

15. The method of claim 11, wherein said annealing step is performed in a range of 600-900° C.

* * * * *